United States Patent [19]
Ohta et al.

[11] Patent Number: 5,183,783
[45] Date of Patent: Feb. 2, 1993

[54] METHOD FOR PRODUCTION OF DIELECTRIC-SEPARATION SUBSTRATE

[75] Inventors: Yutaka Ohta; Konomu Ohki; Masatake Katayama, all of Gunma, Japan

[73] Assignee: Shin-Etsu Handotai Co., Ltd, Japan

[21] Appl. No.: 811,958

[22] Filed: Dec. 23, 1991

[30] Foreign Application Priority Data

Dec. 28, 1990 [JP] Japan .................................. 2-417208

[51] Int. Cl.⁵ ............................................ H01L 21/302
[52] U.S. Cl. ...................................... 437/225; 437/62; 437/228; 437/67; 437/974; 437/233
[58] Field of Search .................... 437/225, 62, 67, 233, 437/228, 242, 974

[56] References Cited

U.S. PATENT DOCUMENTS

| | | | |
|---|---|---|---|
| 4,017,341 | 4/1977 | Suzuki et al. | 437/974 |
| 4,567,646 | 2/1986 | Ishikawa et al. | 437/62 |
| 4,606,936 | 8/1986 | Bajor et al. | 437/62 |
| 4,631,804 | 12/1986 | Roy | 437/974 |
| 4,649,630 | 3/1987 | Boland et al. | 437/66 |
| 5,071,785 | 12/1991 | Nakazato et al. | 437/62 |

Primary Examiner—Brian E. Hearn
Assistant Examiner—Trung Dang
Attorney, Agent, or Firm—Townsend, Snider & Banta

[57] ABSTRACT

Single crystal silicon islands in a dielectric-separation substrate are separated completely and finished in a uniform thickness by preparatorily denuding a single crystal silicon substrate of a warpage suffered to occur therein.

This dielectric-separation substrate is produced by a method which comprises forming a thermal oxide film on a single crystal silicon substrate having grooves incised in advance therein, then forming an irreversibly thermally shrinkable film on the rear surface of said single crystal silicon substrate prior to depositing a polycrystalline silicon thereon, then depositing a polycrystalline silicon on said single crystal silicon substrate, and thereafter grinding said single crystal silicon substrate in conjunction with said irreversibly thermally shrinkable film.

6 Claims, 6 Drawing Sheets

FIG. 4
PRIOR ART

METHOD FOR PRODUCTION OF DIELECTRIC-SEPARATION SUBSTRATE

BACKGROUND OF THE INVENTION

1. Field of the Invention

This invention relates to a method for the production of a dielectric-separation substrate possessed of a supporting member made of polycrystalline siliicon and intended for use in a semiconductor integrated circuit.

2. Description of the Prior Art

Generally, in the semiconductor integrated circuit, since circuit elements such as transistors, diodes, and resistors are integrally formed in a part of a single crystal substrate, these integrated circuit elements must be electrically insulated and separated. As means for the mutual separation of the elements, the pn junction separation, the dielectric separation, etc. are available. The dielectric separation has the advantage of a high voltage breakdown and a small parasitic capacitance as compared with the pn junction separation and, therefore, permits production of a semiconductor integrated circuit of a high voltage breakdown, a large capacity, and a high operating speed. The utilization of this method, therefore, has been drawing attention.

Figure 2A:
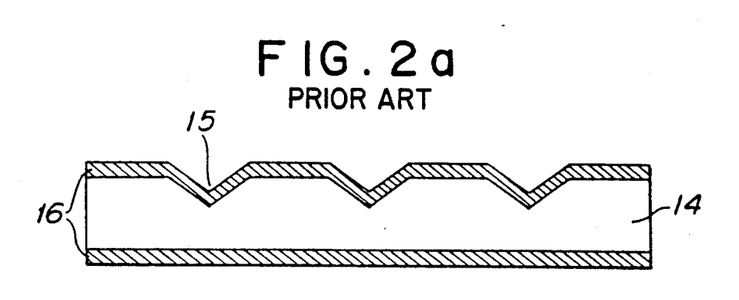
FIGS. 2a to 2c are cross sections illustrating a conventional process for the production of a dielectric-separation substrate.
Figure 2B:
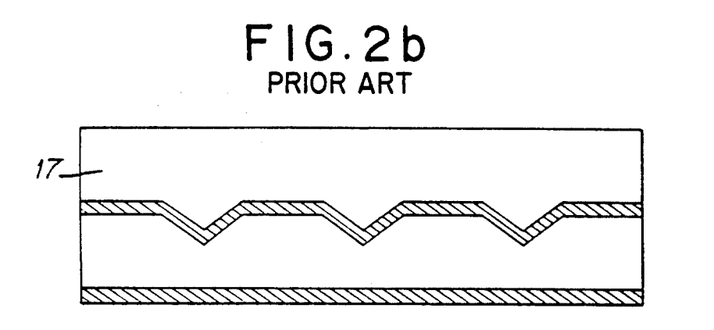
Figure 2C:
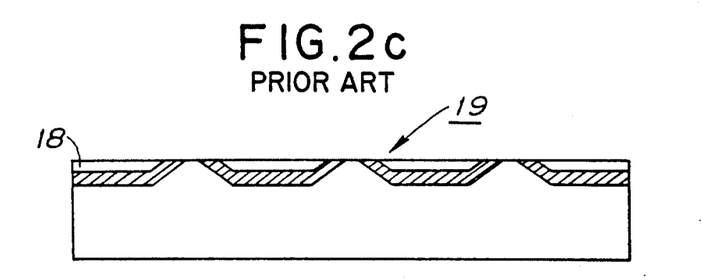

The conventional method for the production of a dielectric-separation substrate, as illustrated in FIG. 2a to FIG. 2c, comprises incising grooves 15 in a single crystal silicon substrate 14, then depositing a polycrystalline silicon on the surface of the single crystal silicon substrate 14 including the grooves 15 thereby forming a polycrystalline silicon layer 17, further grinding the surface of the polycrystalline silicon layer 17, and subsequently grinding the rear surface of the single crystal silicon substrate 14 till the bottom parts of the grooves 15 thereby giving rise to separated single crystal silicon islands 18 and completing a dielectric-separation substrate 19.

Figure 4:
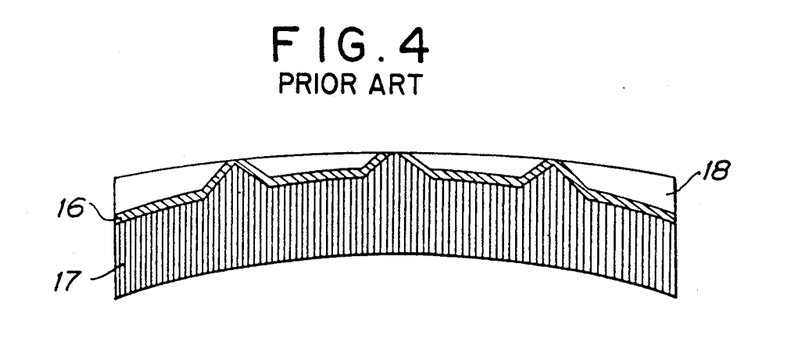
FIG. 4 is a cross section illustrating a dielectric-separation substrate obtained by grinding a single crystal silicon in the state shown in FIG. 3.

In the method described above, when the polycrystalline silicon is deposited at an elevated temperature on the single crystal silicon substrate 13, a warpage exceeding 100 μm occurs in a 4 inch wafer. The substrate sustaining this warpage fails to adhere fast through the medium such as of Wax to a glass plate during the grinding of the surface of the polycrystalline silicon layer 17 or the surface of the single crystal silicon substate 14. If the grinding is carried out in spite of the warped substrate, the single crystal silicon islands 18 have uneven thicknessess as illustrated in FIG. 4 and, at times, these single crystal silicon islands 18 may be incompletely separated. When dielectric-separation substrates of such a defective quality are used, semiconductor integrated circuits cannot be manufactured in a satisfactorily high yield. For the solution of this problem, Japanese Patent Publication SHO 56(1981)-35,024 discloses a method which comprises alternately superposing polycrystalline silicon layers and oxide films. Since the step for deposition of polycrystalline silicon is complicated, this method suffers from high cost and poor productivity.

SUMMARY OF THE INVENTION

This invention, conceived in the urge to solve the problem mentioned above, aims to provide a method for producing a dielectric-separation substrate possessed of completely separated single crystal silicon islands of a uniform thickness by divesting the substrate of an undesirable warpage.

BRIEF DESCRIPTION OF THE DRAWINGS

The other objects and characteristic features of the present invention will become apparent as the disclosure is made in the following description of a preferred embodiment of the invention, as illustrated in the accompanying drawings werein.

DETAILED DESCRIPTION OF THE PREFERRED EMBODIMENTS

This invention is directed to a method for the production of a dielectric-separation substrate having a supporting member made of polycrystalline silicon, characterized by forming a thermal oxide film on a single crystal silicon substrate having grooves incised in advance therein, then forming an irreversibly thermally shrinkable film on the rear surface of the single crystal silicon substrate prior to depositing polycrystalline silicon, subsequently depositing polycrystalline silicon on the single crystal silicon substrate, grinding the surface of the deposited polycrystalline silicon layer, and thereafter grinding the single crystal silicon substrate in conjunction with the irreversibly thermally shrinkable film.

The term "irreversibly thermally shrinkable film" as used herein refers to a filmy deposite which is formed on the rear surface of the single crystal silicon substrate and which, during the growth thereof, induces the phenomenon of thermal shrinkage similarly to that which occurs on the surface and in the interior of a sintered alloy during the course of heating. This thermal shrinkage is irreversible in behavior.

The irreversibly thermally shrinkable film of this invention as a substance comprises silicon nitride or silicon oxynitride ($SiO_xN_y$, providing $Y/X \geq 2$). The film is deposited on the surface of the single crystal silicon substrate by the plasma CVD method at a temperature in the range of from 300° C. to 450° C. or by the LPCVD method at a temperature in the range of from 650° C. to 850° C.

Figure 3:
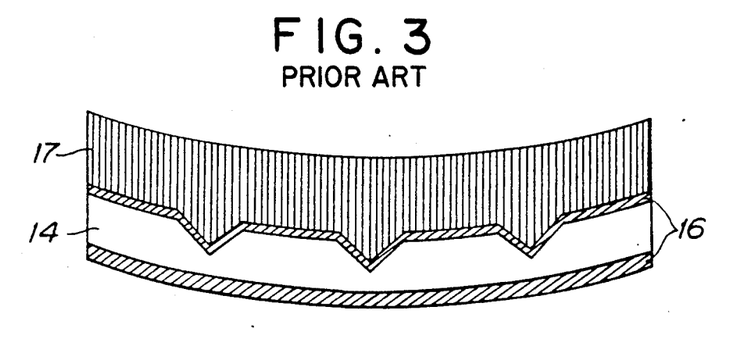
FIG. 3 is a cross section illustrating a substrate which has sustained a warpage during the deposition of polycrystalline silicon.

In this invention, since the irreversibly thermally shrinkable film is formed on the rear surface of the single crystal silicon substrate in advance of the deposition of polycrystalline silicon on the single crystal silicon substrate which has grooves incised therein and has undergone thermal oxidation, the irreversibly thermally shrinkable film succumbs to thermal shrinkage during the deposition of the polycrystalline silicon layer and consequently causes the substrate to generate a force tending to warp itself convexly toward the polycrystalline silicon layer side. In consequence of the shrinkage of the polycrystalline silicon layer deposited at the same time, the substrate generates a force tending to warp itself concavely toward the polycrystalline silicon. As a result, these two warping forces offset each other and divest the substrate of any warp. The substrate of single crystal, the polycrystalline silicon layer deposited on the front surface side, and the irreversibly thermally shrinkable film deposited on the rear surface side, during their cooling, produce a delicate unbalance of inner stress due to their mutually different thermal expansion coefficients. This unbalance can hardly stand comparison with the balance which is held between the inner stress and the warpage due to the thermal shrinkage during the deposition of the polycrystalline silicon layer and which constitutes a matter of concern for this invention. FIG. 3 depicts a warp occurring concavely toward the polycrystalline silicon layer side. In J. Electrochem. Soc.,124, p. 1766 (1977), Suzuki et al. describes this warpage rather to the thermal shrinkage during the deposition of the polycrystalline silicon than to the different thermal expansion coefficients. This conclusion may be logically explained by a postulate that the grain boundary of the polycrystalline silicon is thermally shrink during the deposition thereof and the polycrystals growing thereon are similarly shrunken. If the substrate in the ensuant state is ground, it is allowed to adhere fast satisfactorily to the glass plate because of substantial absence of warp from the substrate. Thus, the polycrystalline silicon layer and then the irreversibly thermally shrinkable film and the single crystal silicon substrate can be ideally ground and the single crystal silicon islands can be formed in a uniform thickness and separated complerely from each other.

Now, this invention will be described below with reference to a working example.

Figure 1A:
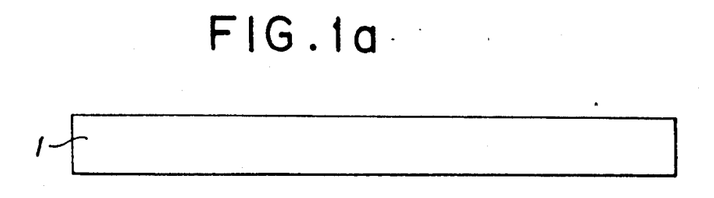
FIGS. 1a to 1c are cross sectional views illustrating various stages of a process as one embodiment of this invention in the production of a dielectric-separation substrate.
Figure 1B:
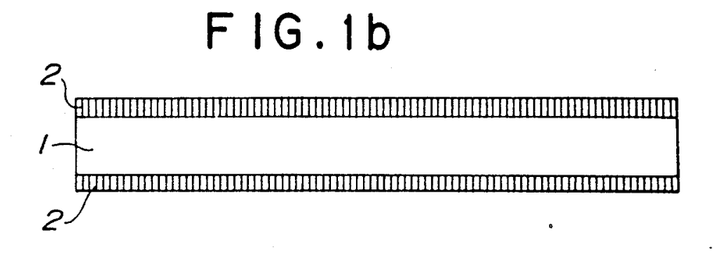
Figure 1C:
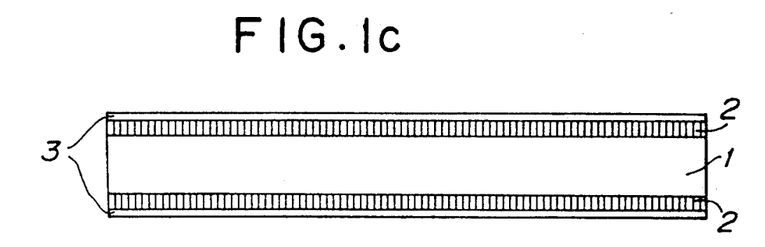
Figure 1D:
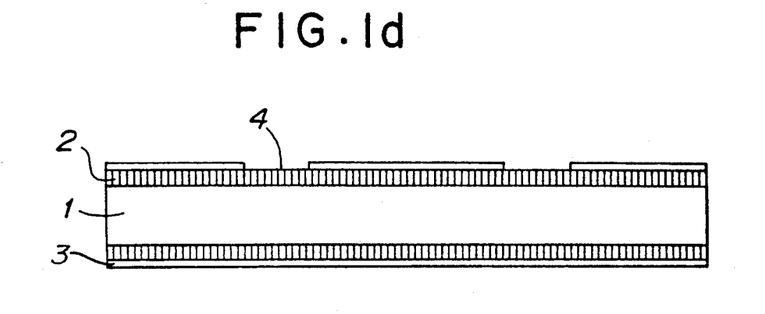
Figure 1E:
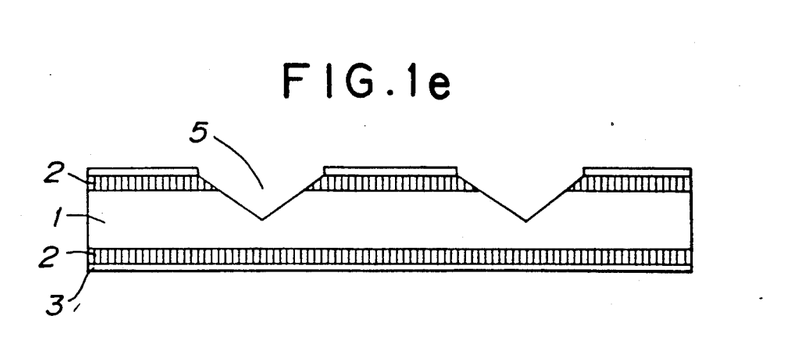
Figure 1F:
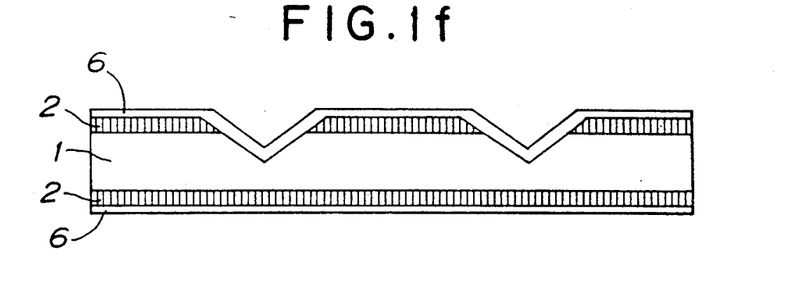
Figure 1G:
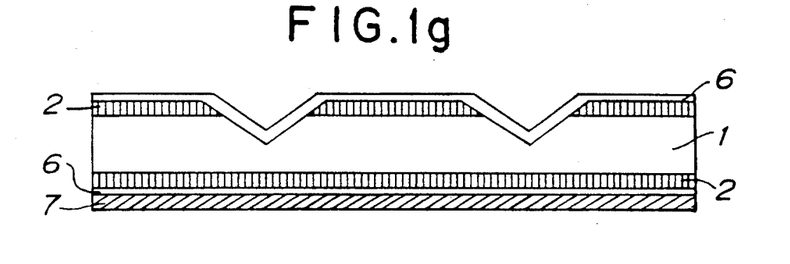
Figure 1H:
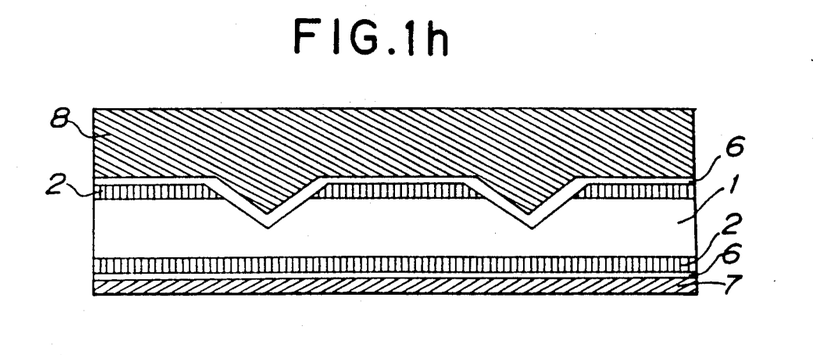
Figure 1I:
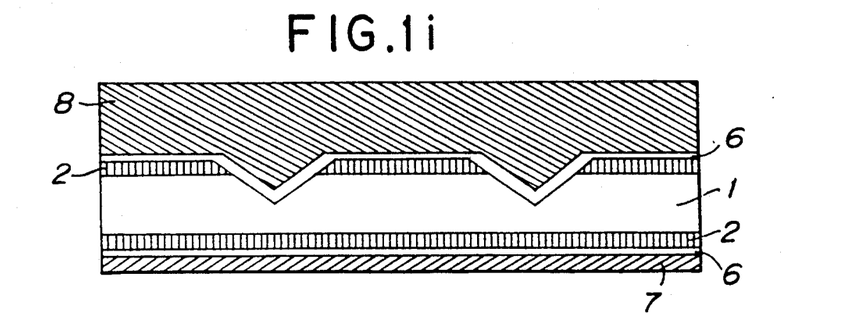
Figure 1J:
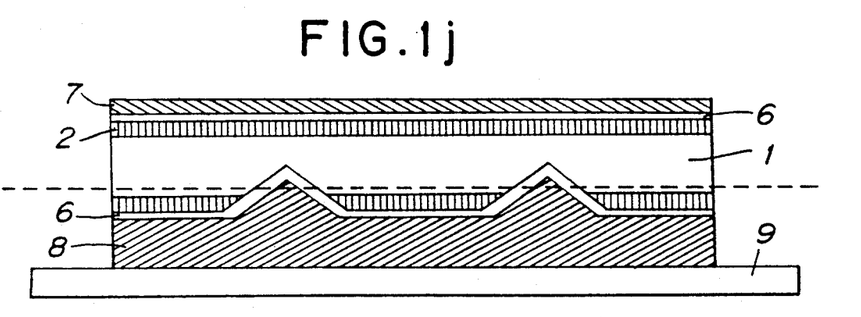
Figure 1K:
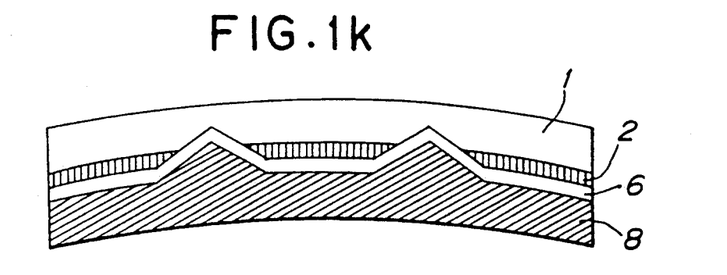
Figure 1L:
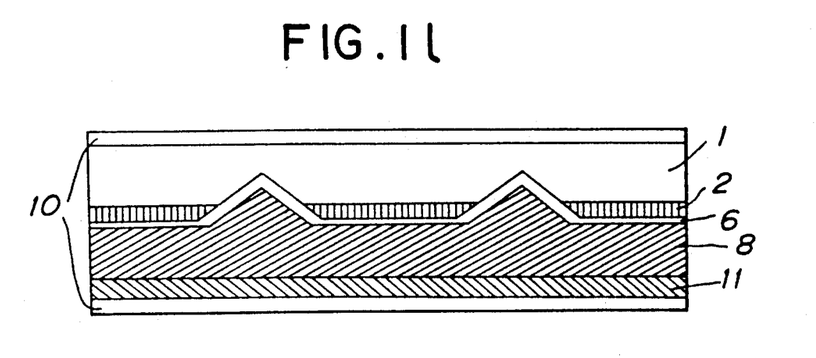
Figure 1M:
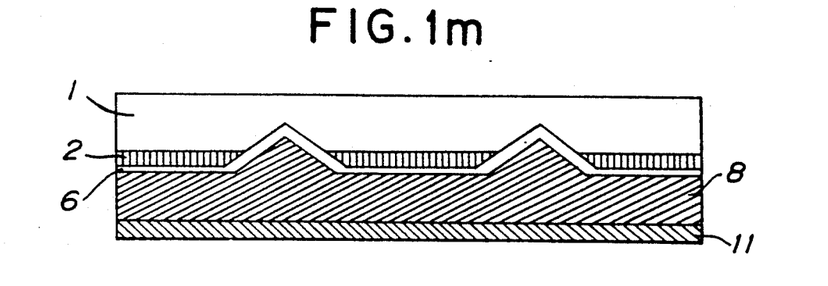
Figure 1N:
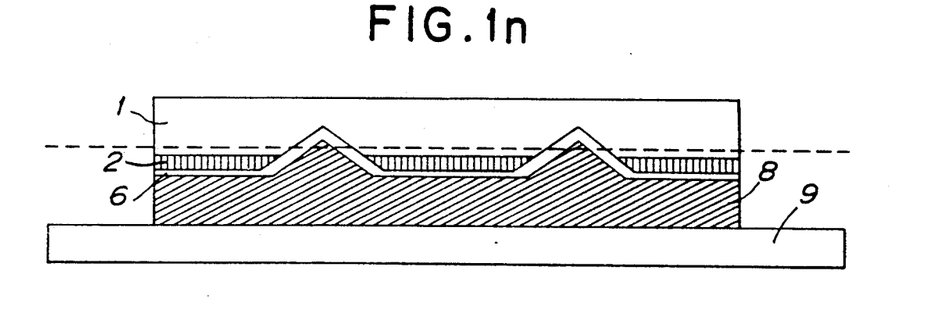
Figure 1O:
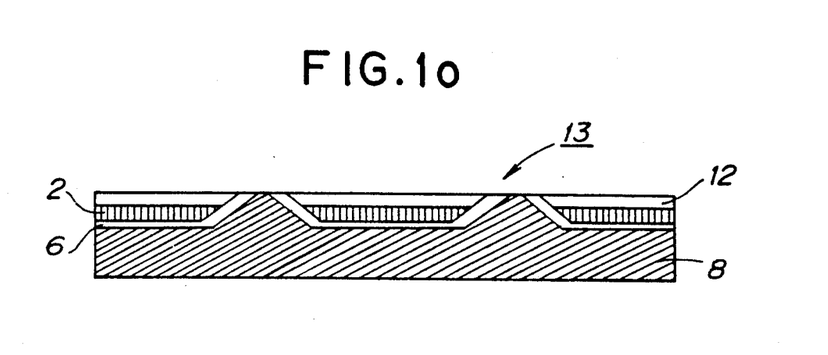

FIG. 1a to FIG. 1o show a process of production of the dielectric-separation substrate of this invention. First, an n type single crystal silicon substrate 1 measuring 450 to 750 μm in thickness and 100 to 150 mm in diameter and having a main surface of (100) as illustrated in FIG. 1a is prepared and n+ layers 2 are formed by diffusing Sb or As in the front and rear surfaces of the single crystal silicon substrate 1 as illustrated in FIG. 1b. Then, photolithographic oxide films 3 about 0.6 μm in thickness are formed as masking materials as illustrated in FIG. 1c and opening parts 4 are formed in parts of the oxide film 3 by a PEP treatment using a glass mask as illustrated in FIG. 1d. Subsequently, anisotropic etching is carried out with an alkaline etching solution composed predominantly of KOH to incise grooves 5 measuring 40 to 75 μm in width and 28 to 52 μm in depth as illustrated in FIG. 1e and then an oxide film 6 is formed by thermal oxidation as illustrated in FIG. 1f. At this time, the single crystal silicon substrate sustains a warp of 0 to 40 μm.

Then, an irreversibly thermally shrinkable film 7 is formed on the surface of the single crystal silicon substrate 1 not including the grooves 5 as illustrated in FIG. 1g. This irreversibly thermally shrinkable film 7 exhibits shrinkability at the temperature of deposition of the polycrystalline silicon. This film is intended for causing the single crystal silicon substrate 1, during the next step for depositing the polycrystalline silicon on the surface of the substrate 1 including the grooves 5, to generate a force tending to warp itself convexly toward the polycrystalline silicon layer side and prevent itself from being warped concavely toward the polycrystalline silicon layer side because of the shrinkage of the polycrystalline silicon layer.

The material for the irreversibly thermally shrinkable film 7 assumes shrinkability at the temperature of deposition of the polycrystalline silicon which falls in the range of from 1100° C. to 1250° C. Silicon nitride and silicon oxynitride ($SiO_xN_y$; providing $Y/X \geq 2$) may be cited as examples of this material. This film is desired to have a thickness in the range of from 0.1 to 0.5 μm. If the thickness of the irreversibly thermally shrinkable film is less than 0.1 μm , the thermal shrinkage at the temperature of deposition of the polycrystalline silicon layer is too small to decrease the concave warp of the substrate toward the polycrystalline silicon layer side after the formation of the polycrystalline silicon layer. If the thickness of the irreversibly thermally shrinkable film exceeds 0.5 μm , the thermal shrinkage at the temperature of deposition of the polycrystalline silicon layer is so large that the substrate after the formation of the polycrystalline silicon layer is unduly heavily warped convexly toward the polycrystalline silicon layer side.

As means for the formation of the irreversibly thermally shrinkable film 7, the CVD method is desirably used and the plasma CVD method which is capable of stably controlling the ratio of silicon atoms and nitrogen atoms or the ratio of silicon atoms, nitrogen atoms, and oxygen atoms in the film is used particularly desirably. The temperature during the formation of this film is desired to be in the range of from 300° C. to 450° C. in the case of the plasma CVD method. When the film is to be made of silicon nitride, the LPCVD method may be adopted for the formation of the film. In this case, the film is formed at a temperature in the range of from 650° C. to 850° C.

Then, a polycrystalline silicon is deposited by the epitaxial method to form a polycrystalline silicon layer 8 on the surface of the single crystal silicon substrate 1 including the grooves 5 as illustrated in FIG. 1h. During the formation of the polycrystalline silicon layer 8, the substrate is caused by the shrinkage of the polycrystalline silicon layer to generate a force tending to Warp itself concavely toward the polycrystalline silicon layer 8 side. Since the irreversibly thermally shrinkable film 7 formed on the rear surface of the single crystal silicon substrate 1 is thermally shrunken during the deposition of the polycrystalline silicon at the temperature of the deposition as described above, however, the substrate is caused to generate a force tending to warp itself convexly toward the polycrystalline silicon layer 8 side. As a result, these warping forces offset each other and the substrate is divested of a warpage substantially completely. The warpage of the substrate after cooling is desired to be in the range of from 0 to 80 μm toward the polycrystalline silicon layer 8 side. If the size of the warpage exceeds 80 μm , the single crystal silicon substrate 1 cannot be satisfactorily ground because the substrate in the subsequent grinding step fails to adhere fast to the glass plate. Thus, the produced single crystal silicon islands have no uniform thickness and are not completely separated.

The temperature of deposition of the polycrystalline polycrystalline silicon is desired to be in the range of from 1100° C. to 1250° C. and the thickness of the polycrystalline silicon layer 8 is desired to be in the range of from 400 to 700 μm .

The size of the warpage of the substrate is varied not only by the thickness of the polycrystalline silicon layer 8 and the thickness of the irreversibly thermally shrinkable film 7 but also by the thickness and diameter of the single crystal silicon substrate 1. The liability of the substrate to warp decreases in accordance as the thickness of the single crystal silicon substrate 1 increases and this liability increases in accordance as the diameter of the single crystal silicon substrate 1 increases.

Then, the surface of the polycrystalline silicon layer 8 is ground as illustrated in FIG. 1i. This grinding is carried out by the conventional grinding technique with the surface of the polycrystalline silicon layer 8 turned upwardly and the substrate held in contact with the glass plate 9 through the medium such as of wax. The reason for adopting this particular method of grinding is that during the next step for grinding the irreversibly thermally shrinkable film 7 and the single crystal silicon substrate 1, the surface condition of the polycrystalline silicon layer 8 adhering to the glass plate 9 affects the condition of smoothness of the surface of the single crystal silicon substrate 1 and, therefore, the surface of the polycrystalline silicon layer 8 must be smoothened in advance of the grinding. Since the warp of the substrate is so small as to fall in the range of from 0 to 80 $\mu$m, the substrate can adhere with fully satisfactory fastness to the glass plate 9 and, as a result, the surface of the polycrystalline silicon layer 8 ca be ground smoothly. The thickness of the polycrystalline silicon layer 8 to be removed by grinding (stock for grinding) is desired to be approximately in the range of from 30 to 60 $\mu$m so that the warpage of the substrate will be kept in the range of from 0 to 80 $\mu$m.

Then, the irreversibly thermally shrinkable film 7 and the single crystal silicon substrate 1 are ground as illustrated in FIG. 1j. This grinding is carried out by the conventional grinding technique with the irreversibly thermally shrinkable film 7 held upwardly and the substrate kept in contact with the glass plate 9 through the medium such as of wax. Since the warpage of the substrate is so small as to fall in the range of from 0 to 80 $\mu$m, the substrate can adhere with satisfactory fastness to the glass plate 9 and the irreversibly thermally shrinkable film 7 and the single crystal silicon substrate 1 can be satisfactorily ground. By continuing this grinding till the single crystal silicon islands are completely separated, the single crystal silicon islands in the produced dielectric-separation substrate are enabled to acquire a uniform thickness.

Incidentally, when the thermally shrinkable film 7 is ground, the substrate ceases to generate a force tending to warp itself convexly toward the polycrystalline silicon layer 8 side. During the grinding, therefore, the substrate tends to warp concavely toward the polycrystalline silicon layer 8 side. In this case, if the strength with which the substrate adheres to the glass plate 9 is weak, the substrate is suffered to warp concavely toward the polycrystalline layer 8. When the grinding is continued in spite of this concave warpage, the single crystal silicon islands cannot be completely separated cannot be given a uniform thickness. This drawback may be precluded by removing the substrate from the glass plate after the irreversibly thermally shrinkable film 7, giving an oxidizing treatment as illustrated in FIG. 1 1 to the substrate which has generated a warpage concavely toward the polycrystalline silicon layer 8, and then removing the oxide film from the surface of the single crystal silicon layer and the surface of the polycrystalline silicon layer thereby correcting the warp to a size falling in the range of from 0 to 80 $\mu$m. FIG. 1k to FIG. 1m depict the process just described which is optionally adopted. The operation of production advances from the step of FIG. 1j directly to that of FIG. 1o unless the special situation described above is present. The oxidation of the substrate is carried out by the conventional method. The wet oxidation, for example, is effected with $H_2O/O_2$ at 1150° C. for a period in the range of from three to 12 hours. In consequence of this oxidizing treatment, the single crystal silicon substrate 1 has the surface thereof oxidized and converted into an oxide film 10 whereas the polycrystalline silicon layer 8 is caused to form a polycrystalline silicon layer region 11 having oxygen diffused on the grain boundary downwardly from the surface thereof in addition to the oxide film 10. Since the oxygen is segregated along the grain boundary, the polycrystalline silicon layer 8 is expanded and, as a result, the concave warpage of the substrate toward the polycrystalline silicon layer 8 side is reduced to a level falling approximately in the range of from 0 to 80 $\mu$m.

The oxide film 10 and the single crystal silicon substrate 1 in their ensuant state are ground by the conventional grinding technique with the single crystal silicon substrate 1 kept upwardly and the substrate held in contact with the glass plate 9 through the medium such as of wax as illustrated in FIG. 1n. Since the warpage of the substrate at the time of the contact is small, the substrate adheres fast satisfactorily to the glass plate 9. As a result, the produced dielectric separation substrate 13 has the single crystal silicon islands 12 separated completely and ground to a uniform thickness as illustrated in FIG. 1o.

By the process of production described above, there can be produced a dielectric-separation substrate which has no warpage in the substrate and contains single crystal silicon islands finished in a uniform thickness and separated completely.

As is clear from the foregoing description, the method of this invention for the production of a dielectric-separation substrate is capable of correcting a warpage generated in the substrate and therefore producing a dielectric-separation substrate having single crystal silicon islands finished in a uniform thickness and separated completely. Thus, the present invention warrants production of semiconductor integrated circuits in a high yield.

What is claimed is:

1. A method for the production of a dielectric-separation substrate having a supporting member made of polycrystaline silicon, characterized by forming a thermal oxide film on a single crystal silicon substrate having grooves incised in advance therein, then forming a irreversibly thermally shrinkable film on the rear surface of said single crystal silicon substrate prior to depositing polycrystalline silicon, subsequently depositing polycrystalline silicon on said single crystal silicon substrate, grinding the surface of the deposited polycrystalline silicon layer, and thereafter grinding said single crystal silicon substrate in conjunction with said irreversibly thermally shrinkable film.

2. A method according to claim 1, wherein said polycrystalline silicon is deposited at a temperature in the range of from 1100° C. to 1250° C. and said irreversibly thermally shrinkable film is a silicon nitride film or silicon oxynitride film ($SiO_xN_y$, providing $Y/X \geq 2$) formed by the plasma CVD method at a temperature in the range of from 300° C. to 450° C.

3. A method according to claim 2, wherein said silicon nitride or silicon oxynitride film ($SiO_xN_y$, providing $Y/X \geq 2$) is formed by the LPCVD method at a temperature in the range of from 650° C. to 850° C.

4. A method according to claim 1, which further comprises removing said irreversibly thermally shrinkable film, forming a thermal oxide film on the surface of said polycrystalline silicon layer, and thereafter grinding said single crystal substrate.

5. A method according to claim 2, which further comprises removing said irreversibly thermally shrinkable film, forming a thermal oxide film on the surface of said polycrystalline silicon layer, and thereafter grinding said single crystal substrate.

6. A method according to claim 3, which further comprises removing said irreversibly thermally shrinkable film, forming a thermal oxide film on the surface of said polycrystalline silicon layer, and thereafter grinding said single crystal substrate.

* * * * *